(12) United States Patent
Takeo et al.

(10) Patent No.: US 6,888,379 B2
(45) Date of Patent: May 3, 2005

(54) PHASE COMPARATOR CIRCUIT

(75) Inventors: Yasuhiko Takeo, Tokyo (JP);
Masatoshi Tobayashi, Tokyo (JP);
Masaki Hirose, Kanagawa (JP); Yukio Akazawa, Kanagawa (JP)

(73) Assignee: NTT Electronics Corporation, Tokyo (JP)

( * ) Notice: Subject to any disclaimer, the term of this patent is extended or adjusted under 35 U.S.C. 154(b) by 35 days.

(21) Appl. No.: 10/088,205

(22) PCT Filed: Oct. 11, 2001

(86) PCT No.: PCT/JP01/08910
§ 371 (c)(1),
(2), (4) Date: Jul. 16, 2002

(87) PCT Pub. No.: WO02/32041
PCT Pub. Date: Apr. 18, 2002

(65) Prior Publication Data
US 2003/0020514 A1 Jan. 30, 2003

(30) Foreign Application Priority Data

Oct. 11, 2000 (JP) ........................................ 2000-310708

(51) Int. Cl.[7] .............................................. G01R 25/00
(52) U.S. Cl. .............................................. 327/3; 327/2
(58) Field of Search .............................. 327/2, 3, 5, 7, 327/10, 12, 8, 9; 324/76.77

(56) References Cited

U.S. PATENT DOCUMENTS

| 3,840,817 A | 10/1974 | Seki | ............................... 327/3 |
| 4,721,904 A | 1/1988 | Ozaki et al. | .............. 324/76.77 |
| 5,661,419 A | 8/1997 | Bhagwan | ......................... 327/8 |
| 6,157,686 A | 12/2000 | Iinuma | ......................... 375/347 |
| 6,493,163 B1 | 12/2002 | Reed et al. | .................... 360/51 |

FOREIGN PATENT DOCUMENTS

JP 6-252654 9/1994

OTHER PUBLICATIONS

Ishihara, N., "A Monolithic 156 Mb/s Clock and Data Recovery PLL Circuit Using the Sample–and–Hold Technique", IEEE J. Solid State Circuits, vol. SC–29, pp. 1566–1571, Dec. 1994.

Hogge, JR., C., "A Self Correcting Clock Recovery Circuit", IEEE Journal of Lightwave Technology, vol. LT–3, No. 6, pp. 1312–1314, Dec. 1985.

*Primary Examiner*—Linh M. Nguyen
(74) *Attorney, Agent, or Firm*—Rothwell, Figg, Ernst & Manbeck

(57) ABSTRACT

A phase detector circuit that prevents a significant loss of lock during input of CIDs (Consecutive Identical Digits) and has a high linearity of a phase to voltage conversion characteristic around a phase-locked point in an operation of comparing phases of random NRZ signals in a phase. By using the phase detector circuit having a circuit configuration containing a delay circuit and a combination of leapt a multiplier circuit and a subtractor circuit, a capability as the PLL circuit of preventing the significant loss of lock can be realized. In addition, since a duty cycle of a pulse appearing at an output terminal 3 of a multiplier circuit 62 approaches 50% as a phase-locked state is approached, a distortion in the phase to voltage conversion characteristic does not appear, and thus high linearity of the phase to voltage conversion characteristic around thus phase-locked point can be realized.

9 Claims, 14 Drawing Sheets

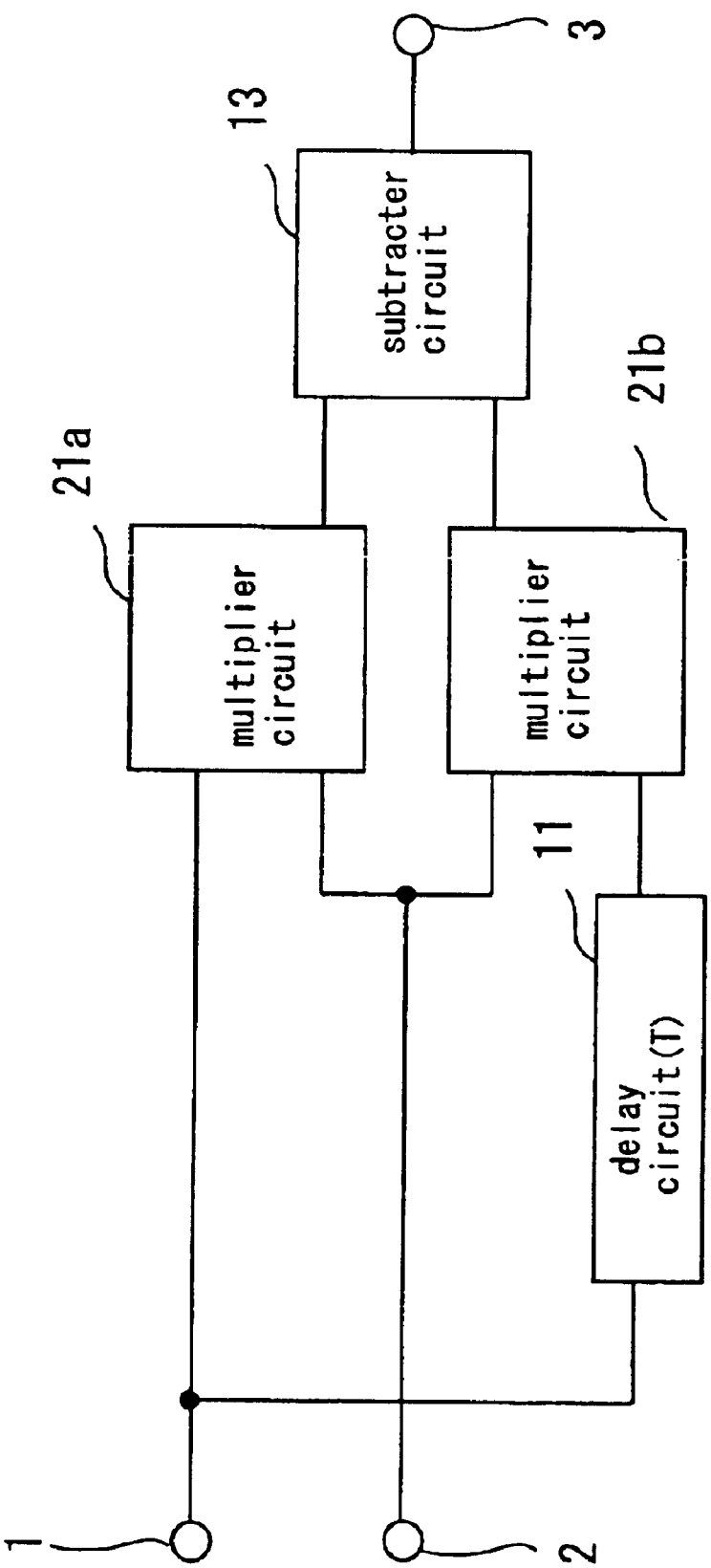
F I G. 4

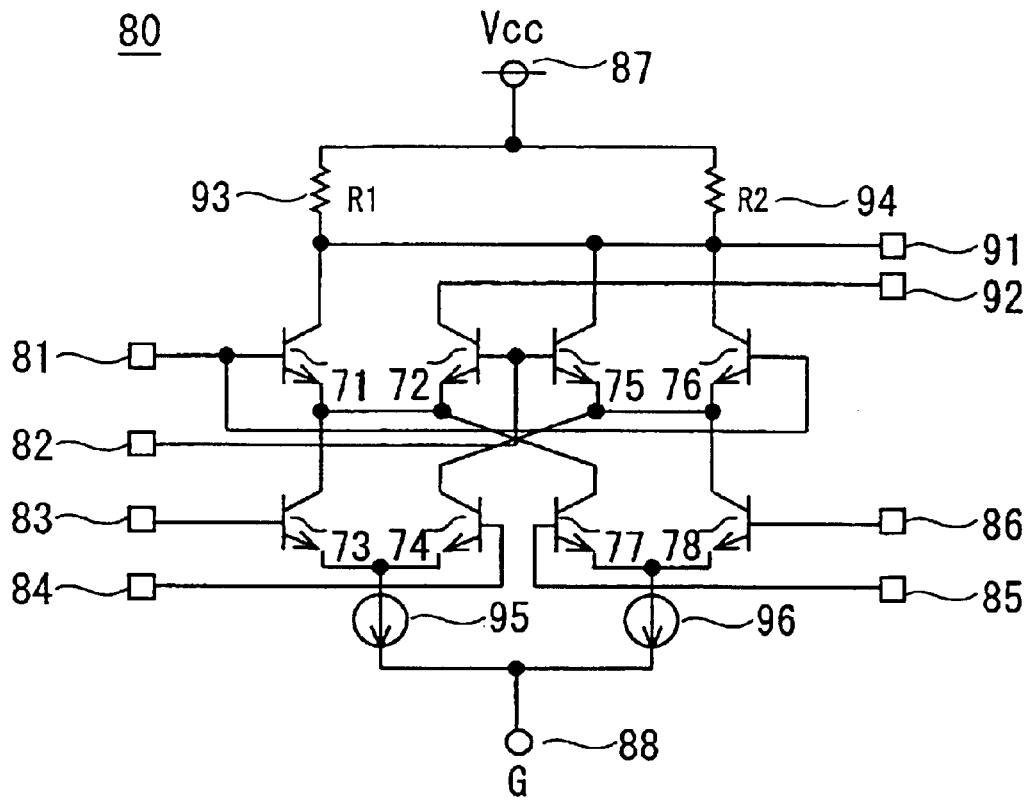
*F I G. 1 3* (PRIOR ART)
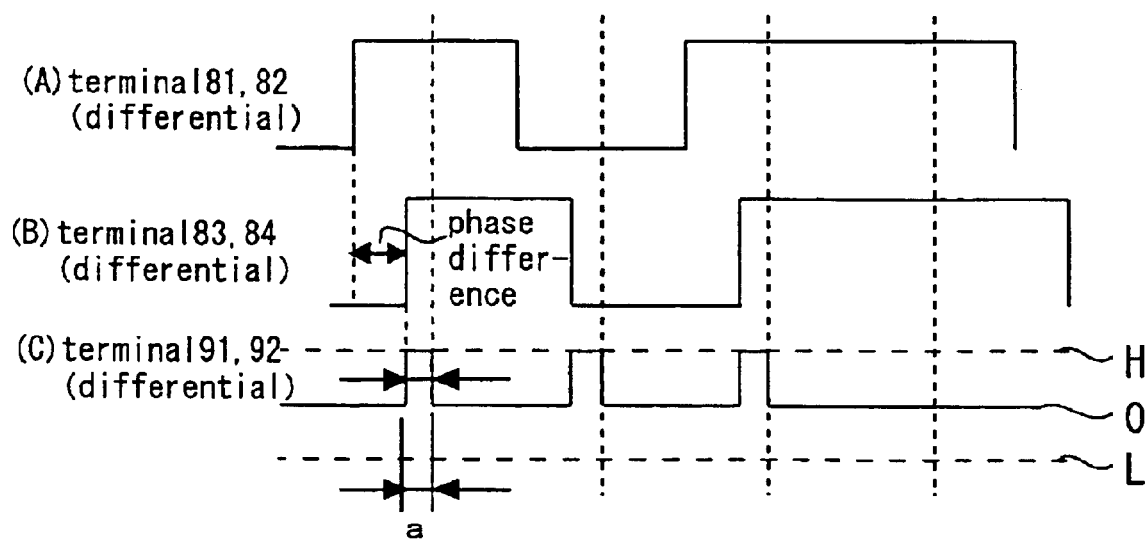
*F I G. 1 4* (PRIOR ART)

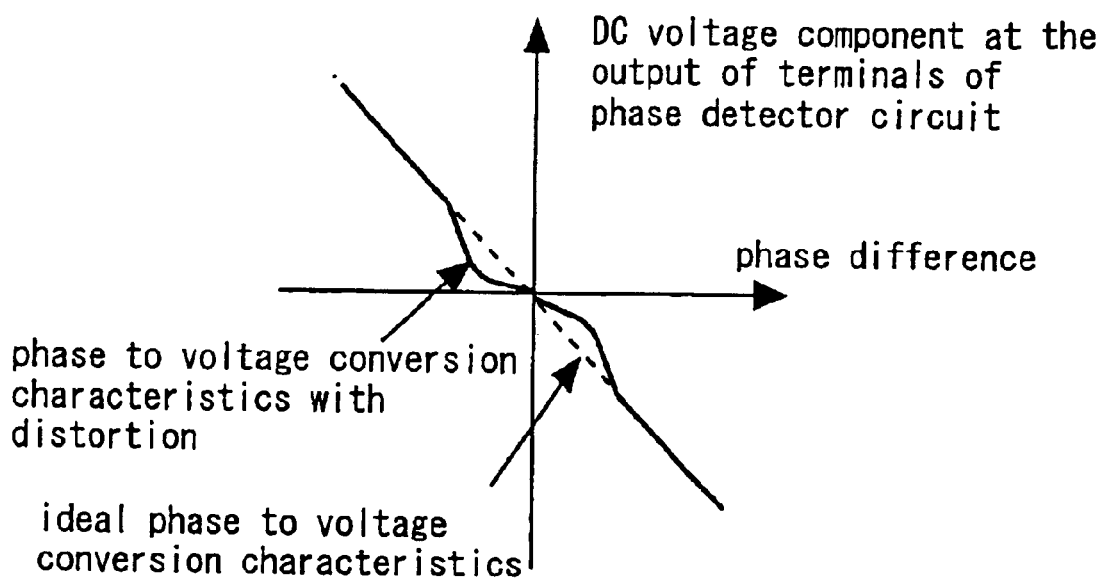
F I G. 1 5 (PRIOR ART)

US 6,888,379 B2

PHASE COMPARATOR CIRCUIT

TECHNICAL FIELD

The present invention relates to a phase detector circuit, and in particular, to a phase detector circuit used as a component of a phase-locked loop (PLL) circuit for extracting a clock from a random NRZ signal.

BACKGROUND ART

A phase detector circuit that is used for extracting a clock from a random NRZ (Non-Return-To-Zero) signal to recover the signal is required to have (1) a mechanism for preventing a significant loss of lock when consecutive identical digits (CIDs) included in the random NRZ signal are input and (2) a linearity of a phase to voltage conversion characteristic around phase-locked point. Here, the random NRZ signal is in the form of a pulse code in which a pulse width equals to a length of a code. The above-described requirement (1) is mainly intended for preventing a significant reduction in a bit error rate of the recovered signal, and the requirement (2) is mainly intended for realizing a high quality of the extracted clock.

In order to address the requirement (1), that is, in order to prevent a significant loss of lock when the CIDs are input, the phase detector circuit often uses a method of not outputting any waveform when the CIDs are input. In order to address the requirement (2), that is, in order to assure the linearity of the phase to voltage conversion characteristic around phase-locked point, it is required to maintain a limited pulse width of the output waveform of the phase detector circuit under phase-locked condition.

FIG. 13 is a circuit diagram of a conventional phase detector circuit used for clock extraction and signal recovery. In FIG. 13, reference numeral 80 denotes a phase detector circuit, reference numerals 81 and 82 denote a pair of differential input terminals for the random NRZ signals, reference numerals 83 and 84 denote a pair of differential input terminals for the random NRZ signals that have the same pattern as those of the signals input to the terminals 81 and 82 and are delayed therefrom by θ in phase, reference numerals 85 and 86 denotes a pair of differential input terminals for the random NRZ signals that are delayed from the signals input to the terminals 81 and 82 by T/2, which is a half of the period T of the signals input to the terminals 81 and 82, reference numerals 91 and 92 denote a pair of differential output terminals of the phase detector circuit 80, reference numerals 87 denotes a terminals of a high potential power supply (Vcc), reference numeral 88 denotes a terminal of a low potential power supply (G), reference numerals 93 (R1) and 94 (R2) denote resistances, reference numerals 71 to 78 denote bipolar transistors, and reference numerals 95 and 96 denote low current circuits. See the reference: N. Ishihara and Y. Akazawa, "A Monolithic 156 Mb/S Clock and Data recovery PLL Circuit Using the Sample-and-Hold Technique", IEEE J. Solid State Circuits, Vol. 29, pp. 1566–1571, December 1994.

FIG. 14 is a timing chart of a PLL circuit using the phase detector circuit 80 shown in FIG. 13. As shown in FIG. 14(A), the random NRZ signals are input to the pair of the differential terminals 81 and 82 of the phase detector circuit 80, and as shown in FIG., 14(B), the random NRZ signals having the same pattern as shown in FIG. 14(A) and delayed by θ in phase are input to the pair of the differential terminals 83 and 84. As a result, as shown in FIG. 14(C), signal having a pulse width a associated with the phase difference θ are output from the pair of the output differential terminals 91 and 92 of the PLL circuit 80. In the PLL circuit circuit, a negative feedback is provided to attain the phase difference of 180 degrees, that is, to provide a delay of T/2, which is a half of the period of the random NRZ signal, and consequently, as shown in FIG. 14(C), the pulse width a at the pair of the output differential terminals 91 and 92 is reduced as the phase-locked state is approached. As shown in FIGS. 14(A) to 14(C), the phase detector circuit 80 cannot physically cope with a pulse width less than a predetermined value due to an effect of capacitance or the like, and thus cannot maintain the accuracy thereof.

FIG. 15 shows a phase to voltage conversion characteristic of the conventional phase detector circuit 80. In FIG. 15, the vertical axis represents a DC voltage component at the pair of the differential terminals 91 and 92, and the horizontal axis represents the phase difference described above. As shown in FIG. 15, while the phase to voltage conversion characteristic is ideally represented by the dotted line, the linearity thereof is compromised in the phase detector circuit 80, which exhibits the characteristic with distortion. If such a phase detector circuit 80 having the linearity of the phase to voltage conversion characteristic compromised is used in the PLL circuit for clock extraction and signal recovery, the phase detector circuit 80 cannot accurately detect the phase difference, so that a time-base variation in the waveform, which is referred to as a jitter, appears in the clock extracted.

As described above, there is a problem that the clock extracted from the PLL circuit using the phase detector circuit of poor linearity of the phase to voltage conversion characteristic is significantly inferior in the quality as a clock.

DISCLOSURE OF THE INVENTION

Thus, the present invention is devised to solve the above problems, and an object of the present invention is to provide a phase detector circuit that prevents a significant loss of lock during input of CIDs and has a high linearity of a phase to voltage conversion characteristic around phase-locked point in an operation of comparing phases of random NRZ signals in a PLL circuit.

A phase detector circuit according to this invention is a phase detector circuit that receives a random NRZ signal Vi(t) having a period of T and a signal Vi(t−θT/2π) having the same period and pattern as those of the signal Vi(t) and delayed from the signal Vi(t) by θ in phase, and outputs a signal including a DC voltage component associated with a phase difference θ between the two signals, characterized in that an output Vo(t) of the phase detector circuit is represented by:

$$Vo(t)=(Vi(t)-Vi(t-T))\times Vi(t-\theta T/2\pi),$$

where the signal Vi(t−T) is delayed from the signal Vi(t) by the period T of the signal Vi(t).

A phase detector circuit according to this invention is a phase detector circuit that outputs a signal including a DC voltage component associated with a phase difference between two input signals, characterized by comprising: a delay circuit for outputting a signal delayed by the time of T, which is equivalent to a period of an input random NRZ signal; a subtracter circuit for outputting a difference between the input random NRZ signal and the signal delayed by the delay circuit; and a multiplier circuit for outputting a product of another input random NRZ signal having the same pattern as that of the input random NRZ signal and the phase difference with respect thereto and an output of the subtracter circuit.

A phase detector circuit according to this invention is a phase detector circuit that outputs a signal including a DC voltage component associated with a phase difference between two input signals, characterized by comprising: a first multiplier circuit for outputting a product of one input random NRZ signal and another input random NRZ signal having the same pattern as that of the one signal and the phase difference with respect thereto; a delay circuit for outputting a signal delayed by the time of T, which is equivalent to a period of the input random NRZ signal; a second multiplier circuit, which is different from the first multiplier circuit, for outputting a product of the another input random NRZ signal and an output of the delay circuit; and a subtracter circuit for outputting a difference between an output of the first multiplier circuit and an output of the second multiplier circuit.

A phase detector circuit according to this invention is a phase detector circuit that outputs a signal including a DC voltage component associated with a phase difference between two input signals, characterized by comprising: a first voltage controlled delay circuit for outputting a delay applied to one input random NRZ signal by controlling the delay with a predetermined first signal; a subtracter circuit for outputting a difference between the one input random NRZ signal and a signal output from the first voltage controlled delay circuit; a multiplier circuit for outputting a product of another input random NRZ signal having the same period and pattern as those of the one input random NRZ signal and the phase difference with respect thereto and an output of the subtracter circuit; and a control circuit for controlling the first voltage controlled delay circuit, the control circuit further comprising: an oscillator circuit for outputting a clock signal having the same period as the period T of the one input random NRZ signal; a phase difference detection circuit for detecting a phase difference between the clock signal output from the oscillator circuit and a predetermined second signal and outputting the phase difference; a low pass filter for extracting a low frequency component from a signal output from the phase difference detection circuit and outputting the low frequency component as the predetermined first signal; and a second voltage controlled delay circuit for controlling the delay applied to the signal output from the oscillator circuit by transmitting the predetermined second signal to the phase difference detection circuit according to the predetermined first signal output from the low pass filter.

A phase detector circuit according to this invention is a phase detector circuit that outputs a signal including a DC voltage component associated with a phase difference between two input signals, characterized by comprising: a first latch circuit for sampling an input random NRZ signal at an input clock signal; a second latch circuit for sampling an output of the first latch circuit at the input clock signal; a subtracter circuit for outputting a difference between an output signal of the first latch circuit and an output signal of the second latch circuit; a delay circuit for outputting a signal delayed by the time of T, which is equivalent to a period of the input random NRZ signal; and a multiplier circuit for outputting a product of an output signal of the subtracter circuit and an output signal of the delay circuit.

A phase detector circuit according to this invention is a phase detector circuit that outputs a signal including a DC voltage component associated with a phase difference between two input signals, characterized by comprising: a delay circuit for outputting a signal delayed by the time of (T−δT), which is a little shorter than the period T of one input random NRZ signal; a subtracter circuit for outputting a difference between the one input random NRZ signal and the signal delayed by the delay circuit; a multiplier circuit for outputting a product of another input random NRZ signal having the same pattern as that of the one input random NRZ signal and the phase difference with respect thereto and an output of the subtracter circuit.

A phase detector circuit according to this invention is a phase detector circuit that receives a random NRZ signal $Vi(t)$ having a period of T and a signal $Vi(t-\theta T/2\pi)$ having the same period and pattern as those of the signal $Vi(t)$ and delayed from the signal $Vi(t)$ by $\theta$ in phase, and outputs a signal including a DC voltage component associated with a phase difference $\theta$ between the two signals, characterized in that an output $Vo(t)$ of the phase detector circuit is represented by:

$$Vo(t)=(Vi(t)-Vi(t-(T-\delta T)))\times Vi(t-\theta T/2\pi),$$

where the signal $Vi(t-(T-\delta T))$ is delayed from the signal $Vi(t)$ by the time of $(T-\delta T)$, which is a little shorter than the period T of the signal $Vi(t)$.

BRIEF DESCRIPTION OF THE DRAWINGS

FIG. 4 is a block diagram of a phase detector circuit for a random NRZ signal according to a second embodiment of this invention;

FIG. 13 is a circuit diagram of a conventional phase detector circuit used for clock extraction and signal recovery;

FIG. 14 is a timing chart of a PLL circuit (PLL) using the phase detector circuit 80 shown in FIG. 13; and FIG. 15 shows a phase to voltage conversion characteristic of the conventional phase detector circuit 80.

BEST MODE FOR CARRYING OUT THE INVENTION

Now, embodiments of the present invention will be described in detail with reference to the drawings.

First Embodiment

Figure 1:
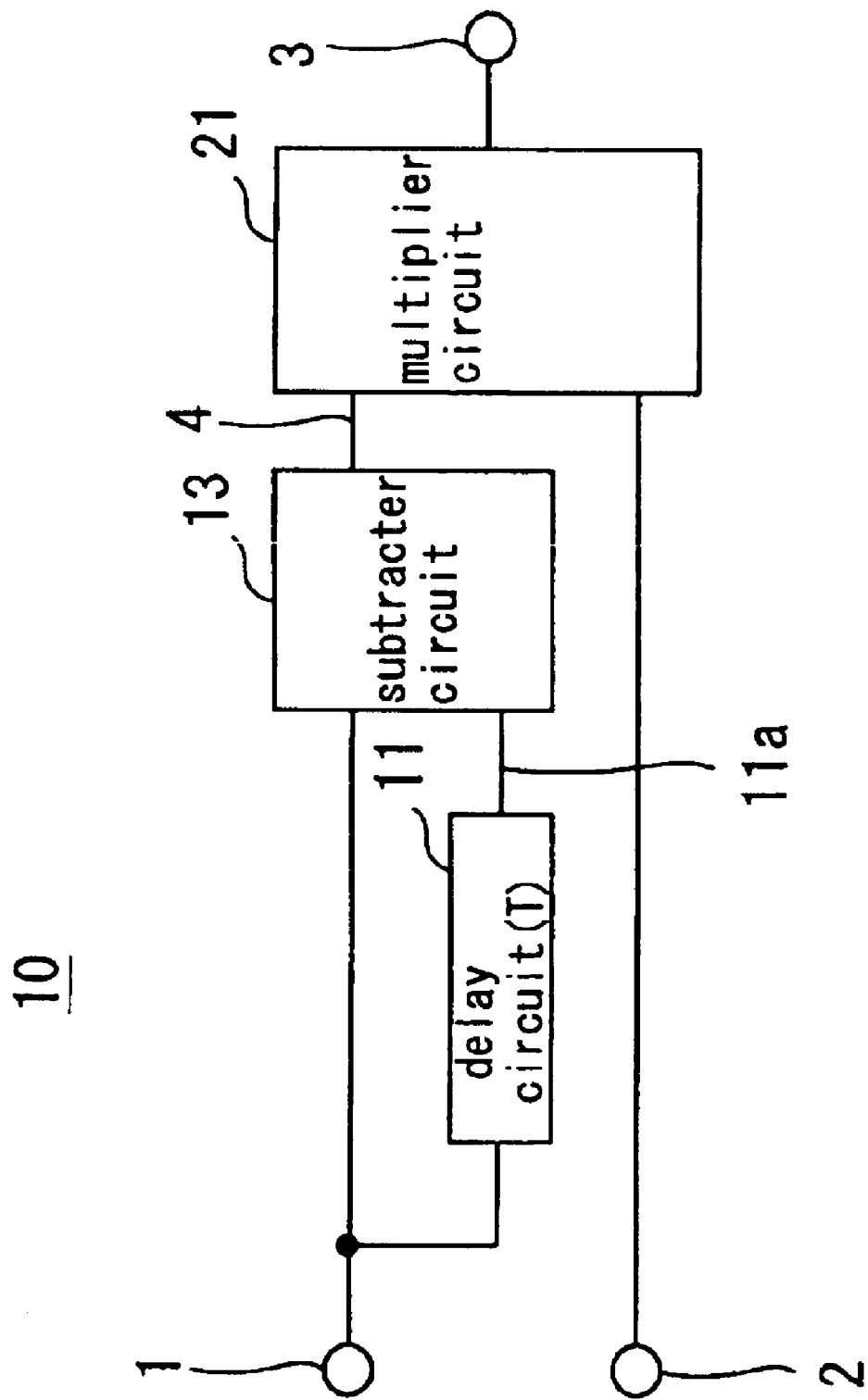
FIG. 1 is a block diagram of a phase detector circuit for a random NRZ signal according to a first embodiment of the present invention.

FIG. 1 is a block diagram of a phase detector circuit for a random NRZ signal according to a first embodiment of the present invention. In FIG. 1, reference numeral 10 denotes a phase detector circuit of this invention, reference numeral 1 denotes an input terminal for the random NRZ signal, reference numeral 2 denotes a terminal to which the random NRZ signal having the same pattern as that of the signal input to the terminal 1 and delayed therefrom by θ in phase is input, reference numeral 11 denotes a delay circuit for delaying the random NRZ signal input to the terminal 1 by the time of T, which is equivalent to a period thereof, reference numeral 11a denotes an output terminal of the delay circuit 11, reference numeral 13 denotes a subtracter circuit for providing the difference between the signal input to the terminal 1 and the signal delayed by the time of T by the delay circuit 11, reference numeral 21 denotes a multiplier circuit for providing the product of the subtraction result 4 of the subtracter circuit 13 and the random NRZ signal input to the terminal 2, and reference numeral 3 denotes an output terminal of the multiplier circuit 21.

As shown in FIG. 1, inputs are the random NRZ signals applied to the terminals 1 and 2, which have the same pattern. However, the signals are different in phase, and a PLL circuit described later provides the negative feedback of the phase difference, thereby realizing the phase lock.

Figure 2:
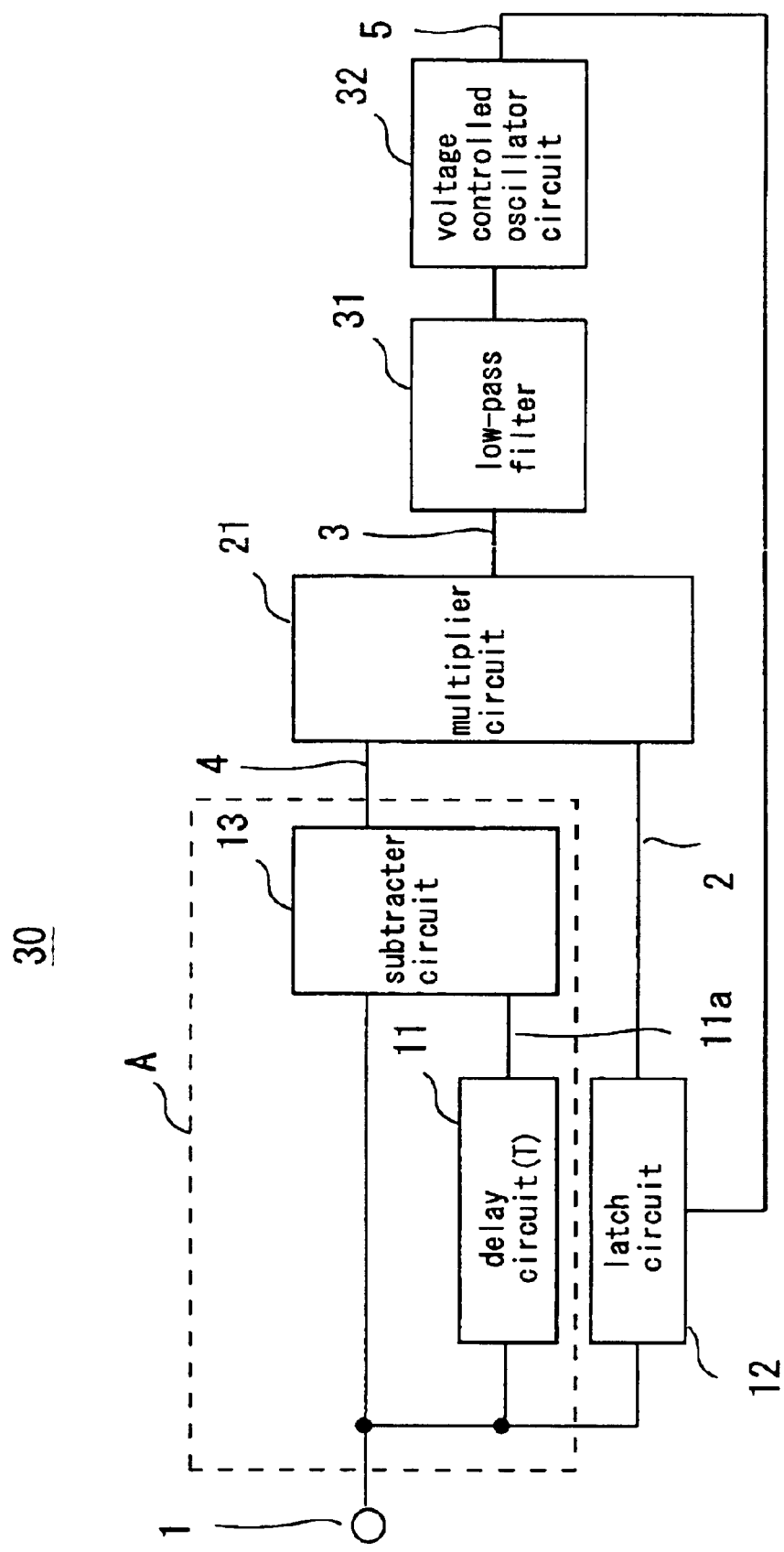
FIG. 2 is a block diagram of a PLL circuit according to the first embodiment of this invention.

FIG. 2 is a block diagram of the PLL circuit according to the first embodiment of this invention. Since a part in FIG. 2 assigned the same reference numeral as in FIG. 1 is the same component, the description thereof will be omitted. In FIG. 2, reference numeral 30 denotes a PLL circuit of this invention, reference numeral 12 denotes a latch circuit for supplying a random NRZ signal to the input terminal 2 of the multiplier circuit, the random NRZ signal having the same pattern as that of the random NRZ signal input to the terminal 1 and phase information on the signal output from the terminal 5 of a voltage controlled oscillator circuit 32 (described later), and a D-type flip flop or the like is used as the latch circuit. Reference numeral 31 denotes a low-pass filter, which involves an integration term in the transfer function thereof by using a normal filter in combination with a charge pump and so on in order to enhance the capability of preventing significant loss of lock when the CIDs are input, which is one of the characteristics of the PLL circuit 30. Reference numeral 32 denotes a voltage controlled oscillator circuit capable of changing an oscillation frequency (output 5) according to the output voltage of the low-pass filter 31.

Figure 3:
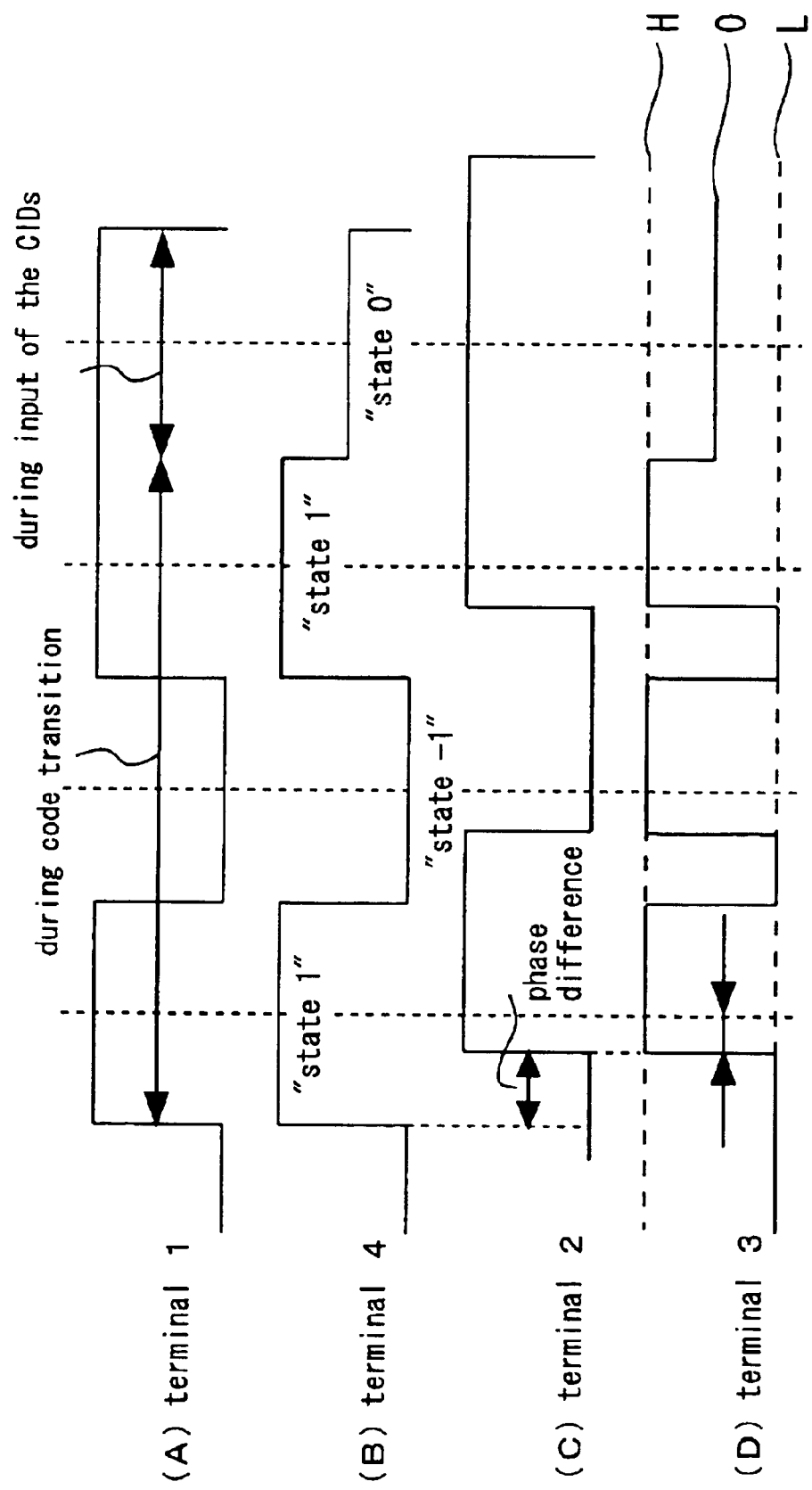
FIG. 3 is a timing chart for the PLL circuit 30 according to the first embodiment of this invention.

FIG. 3 is a timing chart for the PLL circuit 30 according to the first embodiment of this invention. FIG. 3(A) represents the random NRZ signal input to the terminal 1, FIG. 3(B) represents the signal at the terminal 4 of the subtracter circuit 13, which is one of the input signals of the multiplier circuit 21, FIG. 3(C) represents the signal at the terminal 2 of the latch circuit 12, which is the other of the input signals of the multiplier circuit 21, and FIG. 3(D) represents the signal at the output terminal 3 of the multiplier circuit 13.

As shown in FIGS. 3(A) to 3(D), according to the code transition of the random NRZ signal input to the terminal 1 (during code transition or during input of the CIDs), the output terminal 4 of the subtracter circuit 13 exhibits one of three states: a rise (state 1); a fall (state−1); and a non-transition (state 0). This means that the circuit block consisting of the delay circuit 11 for delaying the random NRZ signal by the time equivalent to the period thereof and the subtracter circuit 13 serves as a code transition detection circuit A for the random NRZ signal input to the terminal 1.

During code transition, the code transition detection circuit A detects the rise (state 1) or fall (state−1). Thus, when the output signal of the code transition detection circuit A appearing at the terminal 4 and the random NRZ signal input to the terminal 2 are multiplied in the multiplier circuit 21, a pulse having a duty cycle corresponding to the phase difference between the random NRZ signals applied to the terminals 1 and 2 appears at the output terminal 3 of the multiplier circuit 21. The duty cycle does not depend on whether the random NRZ signals applied to the terminals 1 and 2 are in the state of the rise (state 1) or fall (state−1). The duty cycle constitutes the DC voltage component by the action of the low pass filter 31, and the phase lock function is realized through negative feedback.

On the other hand, during input of the CIDs, because the code transition detection circuit A detects the non-transition (state 0), even if the output signal of the code transition detection circuit A appearing at the terminal 4 and the random NRZ signal input to the terminal 2 are multiplied in the multiplier circuit 21, no waveform appears at the output terminal 3 thereof. Thus, the low pass filter 31 receives no waveform and maintains the current state, so that the capability as the PLL circuit of preventing significant loss of lock, which is one of the characteristics of the phase detector circuit of this invention, can be realized.

In the PLL circuit, a negative feedback is provided to attain the phase difference of 180 degrees, that is, to delay the random NRZ signal by T/2, which is a half of the period thereof, and consequently, as shown in FIG. 3, the duty cycle of the pulse appearing at the output terminal 3 of the multiplier circuit 21 approaches 50% as the phase-locked state is approached. Thus, the distortion in the phase to voltage conversion characteristic of the conventional phase detector circuit 80 as shown in FIG. 15 does not appear, and the high linearity of the phase to voltage conversion characteristic around phase-locked point, which is another characteristic of the phase detector circuit of this invention, can be realized.

In the phase detector circuit 10 of this invention shown in FIG. 1, the input signals at the terminals 1 and 2 are represented by Vi(t) and Vi(t−θT/2π), respectively. Here, reference symbol θ represents the phase difference of the input signal at the terminal 2 with respect to the signal at the terminal 1, and accordingly, the term θT/2π represents the time delay of the signal at the terminal 2 with respect to the input signal at the terminal 1. Since the output signal of the delay circuit 11 that delays the random NRZ signal input to the terminal 1 by T, which is equivalent to the period thereof, can be represented by Vi(t−T), a signal Vo(t) at the output terminal 3 of the multiplier circuit 21, which is the output of the phase detector circuit 10, can be represented by the formula:

$$Vo(t) = (Vi(t) - Vi(t-T)) \times Vi(t - \theta T/2\pi) \qquad (1)$$

Therefore, instead of the circuit configuration of the phase detector circuit 10 shown in FIG. 1, another circuit configuration that satisfies the formula (1) may be used.

As described above, according to the first embodiment, the capability as the PLL circuit of preventing a significant loss of lock can be realized by using the phase detector circuit having a circuit configuration that satisfies the formula (1), for example, a circuit configuration as shown in FIG. 1. In addition, since the duty cycle of the pulse appearing at the output terminal 3 of the multiplier circuit 21 approaches 50% as the phase-locked state is approached, the distortion in the phase to voltage conversion characteristic does not appear, and the high linearity of the phase to voltage conversion characteristic around phase-locked point can be realized.

Second Embodiment

FIG. 4 is a block diagram of a phase detector circuit for a random NRZ signal according to a second embodiment of this invention. Since a part in FIG. 4 assigned the same reference numeral as in FIG. 1 is the same component, the description thereof will be omitted. In FIG. 4, reference numeral 40 denotes a phase detector circuit of this invention, reference numeral 21a denotes a multiplier circuit for providing the product of the signal input to the terminal 1 and the signal input to the terminal 2, reference numeral 21b denotes a multiplier circuit for providing the product of the signal input to the terminal 2 and the signal delayed by the time of T by the delay circuit 11, and reference numeral 13 denotes a subtracter circuit for providing the difference between the outputs of the multiplier circuits 21a and 21b.

In the circuit configuration shown in FIG. 4, assuming that the input signals applied to the terminals 1 and 2 are represented by Vi(t) and Vi(t−θT/2π), respectively, and considering that the output signal of the delay circuit 11 can be represented by Vi(t−T), the signal Vo(t) at the output terminal 3 of the subtracter circuit 13, which is the output of the phase detector circuit 40, can be represented by the formula:

$$Vo(t) = Vi(t) \times Vi(t - \theta T/2\pi) - Vi(t - T) \times Vi(t - \theta T/2\pi) \qquad (2)$$
$$= (Vi(t) - Vi(t - T)) \times Vi(t - \theta T/2\pi))$$

By comparison between the formulas (1) and (2), it can be confirmed that the circuit configurations shown in FIGS. 1 and 4 have the equivalent function. The circuit configuration shown in FIG. 1 is a minimal configuration for conducting the calculation described as the formula (1), and is advantageously suitable for miniaturization of the circuit and reduction of power consumption. On the other hand, the circuit configuration shown in FIG. 4 is superior in symmetry as a circuit and advantageously suitable for integration.

As described above, according to the second embodiment, by using the phase detector circuit having a circuit configuration that satisfies the formula (2), for example, a circuit configuration as shown in FIG. 4, the same function as in the first embodiment, the superior symmetry as a circuit, and the suitability for integration can be advantageously provided.

Third Embodiment

As for the phase detector circuit 10 shown in FIG. 1, the delay in the delay circuit 11 is restricted to the time of T, which is the period of the random NRZ signal input to the terminal 1, and in such a case, the mechanism for preventing significant loss of lock when the CIDs signal are input, and the linearity of the phase to voltage conversion characteristic around phase-locked point can be realized. Here, if a circuit simply configured, such as a buffer circuit, is used as the delay circuit 11, the delay may be varied due to variation of power supply voltage, variation of temperature, and variation in production.

Figure 5:
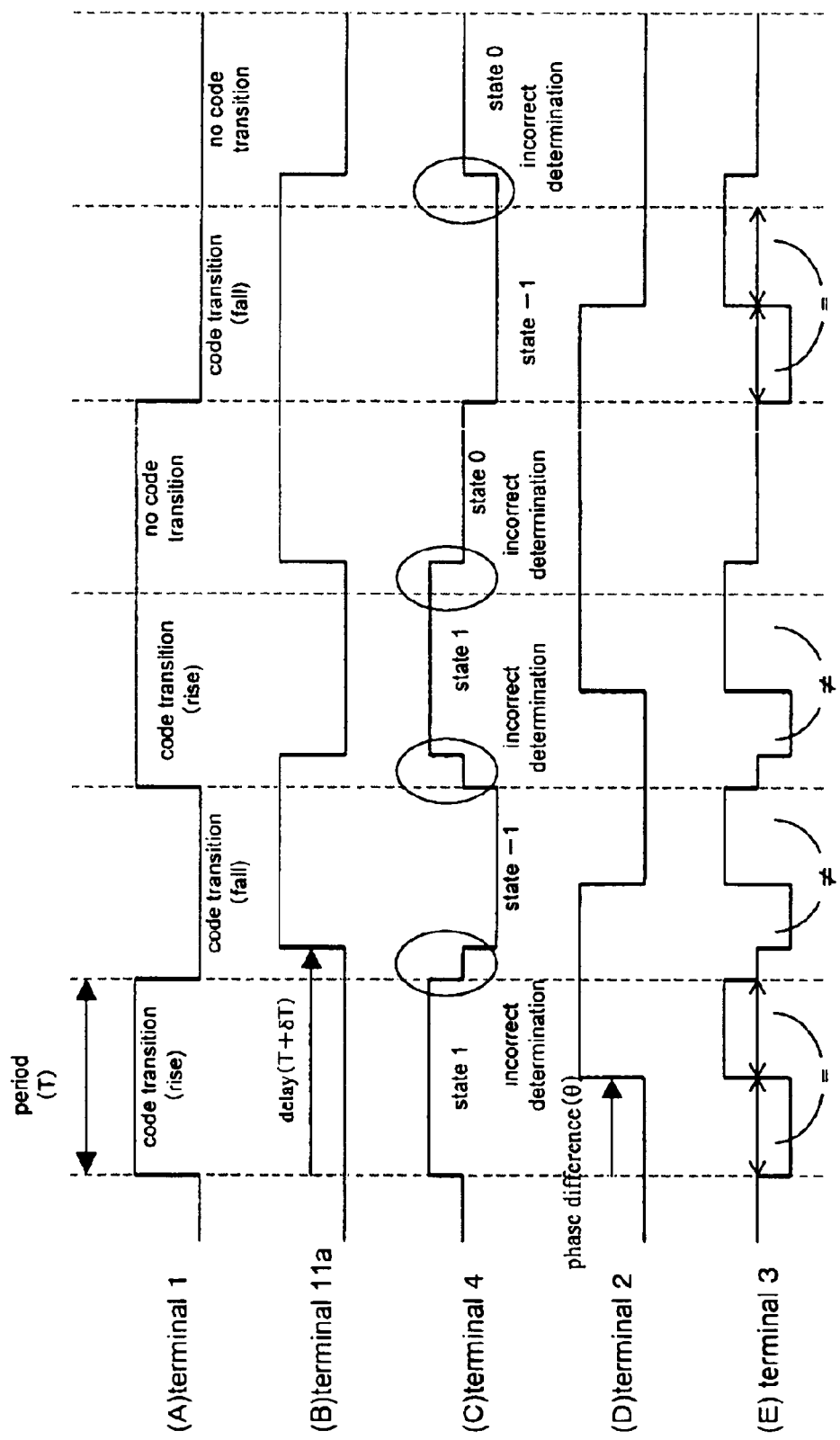
FIG. 5 is a timing chart for a phase detector circuit according to a third embodiment of this invention which uses a delay circuit having a delay time more than T, specifically, a delay time of (T+δT)

FIG. 5 is a timing chart for a phase detector circuit according to the third embodiment of this invention which uses a delay circuit having a delay time more than T, specifically, a delay time of (T+δT). FIG. 5(A) represents the random NRZ signal input to the terminal 1, FIG. 5(B) represents the signal at the output terminal 11a of the delay circuit 11, FIG. 5(C) represents the signal at the output terminal 4 of the subtracter circuit 13, which is one of the input signals of the multiplier circuit 21, FIG. 5(D) represents the signal at the other input terminal 2 of the multiplier circuit 21, and FIG. 5(E) represents the signal at the output terminal 3 of the multiplier circuit 21, which is the output signal of the phase detector circuit 10.

As shown in FIGS. 5(A) to 5(E), according to the code transition of the random NRZ signal input to the terminal 1 (during code transition or during input of the CIDs signal), the output terminal 4 of the subtracter circuit 13 exhibits one of three states: a rise (state 1); a fall (state −1); and a non-transition (state 0). However, due to the deviation in the delay time of δT in the delay circuit 11, the state is incorrectly determined in the first δT in the period following the period during which the code is changed at the terminal 1. Multiplication of this waveform and the random NRZ signal input to the terminal 2 in the multiplier circuit 21 results in a waveform at the terminal 3, the waveform having a duty cycle associated with the phase difference between the signals input to the terminals 1 and 2, in this waveform also, a behavior departing from the ideal one occurs in the first δT in that period, which appears in the form of a waveform distortion depending on the input signal pattern. In this waveform, the average output level varies among the periods. For example, while in the first period, the high level and the low level continues for the same duration, the high level continues longer than the low level in the second period, therefore, as for the average values for the periods, the output level for the second period is higher than that for the first period. This means that the output level of the low pass filter 31 (FIG. 2) varies among the periods and fluctuates irregularly. As a result, the clock signal at the terminal 5 of the voltage controlled oscillator circuit 32 (FIG. 2) that receives the fluctuating signal exhibits a time-base variation, which is referred to as a jitter, in the waveform thereof, and the quality of the clock signal may be seriously degraded.

As described above, in the configuration of the phase detector circuit 10 shown in FIG. 1, what is important is how to suppress the irregular distortion in the output waveform due to the variation of power supply voltage, variation of temperature, variation in production and the like, and how to maintain the high quality of the clock signal extracted by the PLL circuit, specifically, a low jitter characteristic.

The third embodiment of this invention aims to provide a phase detector circuit that implements the PLL circuit capable of extracting the high quality clock signal with a low jitter characteristic by realizing the mechanism for preventing the significant loss of lock when the CIDs signal are input, providing the high linearity of the phase to voltage conversion characteristic around phase-locked point, and suppressing the irregular distortion in the output waveform in the PLL circuit used for extracting the clock signal and recovering the signal from the random NRZ signal.

Figure 6:
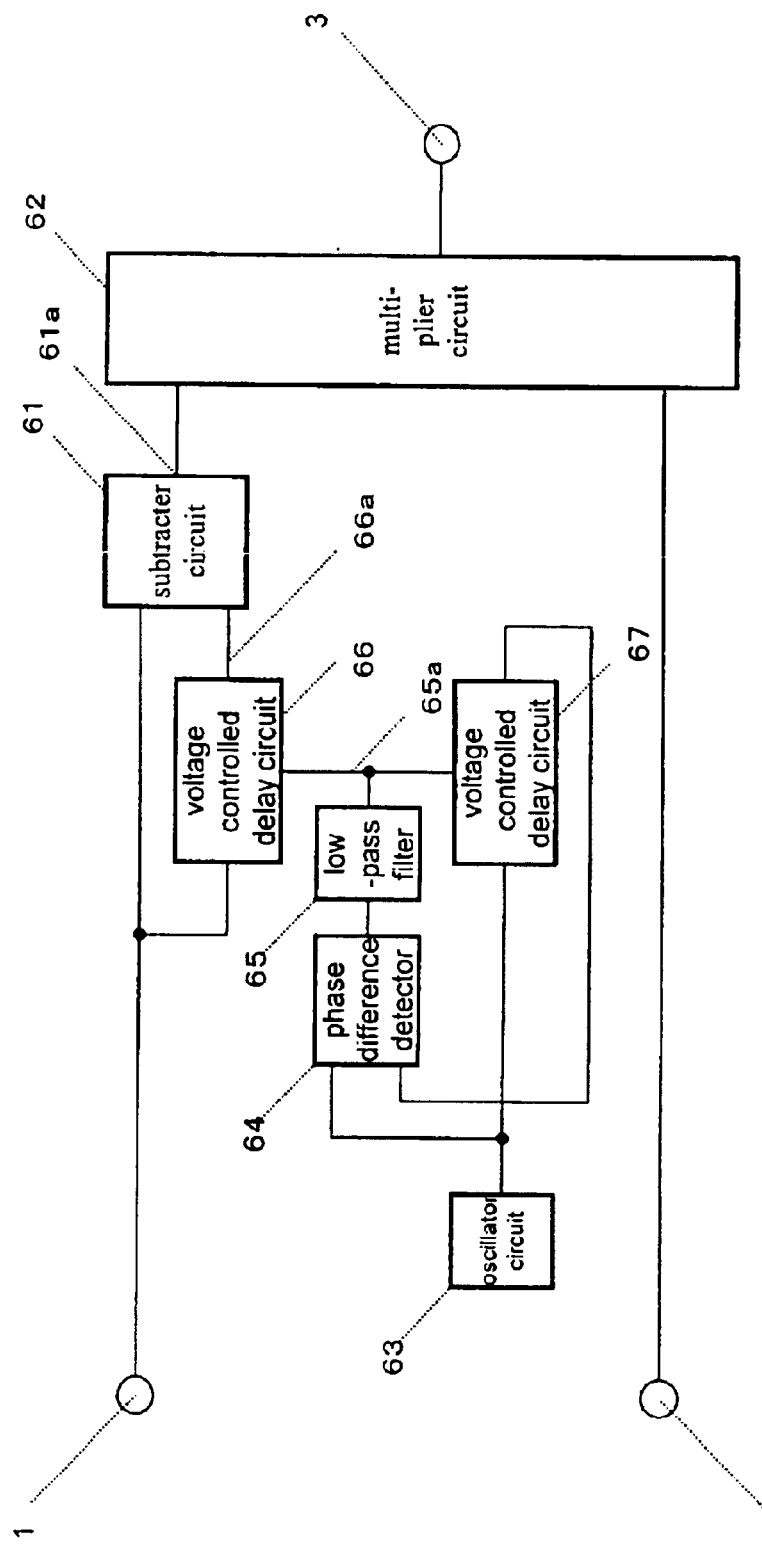
FIG. 6 is a block diagram of the phase detector circuit according to the third embodiment of this invention.

FIG. 6 is a block diagram of the phase detector circuit according to the third embodiment of this invention. In FIG. 6, reference numeral 60 denotes a phase detector circuit according to the third embodiment of the present invention, reference numeral 1 denotes an input terminal for the random NRZ signal having the period of T, reference numeral 2 denotes a terminal to which the random NRZ signal having the same pattern and period (T) as that of the signal input to the terminal 1 and delayed therefrom by θ in phase is input, reference numeral 66 denotes a voltage controlled delay circuit (first voltage controlled delay circuit) for controlling the delay applied to the signal input to the terminal 1 with the signal at an output terminal 65a of a low pass filter 65 described later (a predetermined first signal), reference numeral 61 denotes a subtracter circuit for providing the difference between the signal input to the terminal 1 and the output signal of the voltage controlled delay circuit 66, reference numeral 62 denotes a multiplier circuit for providing the product of the subtraction result of the subtracter circuit 61 and the signal input to the terminal 2, and reference numeral 3 denotes an output terminal of the multiplier circuit 62, which is the output terminal of the phase detector circuit 60. Reference numeral 63 denotes an oscillator circuit for oscillating the clock signal having the same period as the period (T) of the signal input to the terminal 1, and reference numeral 64 denotes a phase difference detection circuit for detecting the phase difference between the output clock signal of the oscillator circuit 63 and an output signal of a voltage controlled delay circuit 67 described later (a predetermined second signal), which may be a typical phase difference detection circuit that detects the phase difference between the two input clock signals. Reference numeral 65 denotes a low pass filter for extracting the low frequency component from the detection result of the phase difference detection circuit 64, and reference numeral 67 denotes a voltage controlled delay circuit (second voltage controlled delay circuit) for controlling the delay applied to the output clock signal of the oscillator circuit 63 with the signal at the output terminal 65a of the low pass filter 65.

As shown in FIG. 6, inputs are the random NRZ signals applied to the terminals 1 and 2, which have the same pattern. However, the signals are different in phase, and the PLL circuit described later provides the negative feedback of the phase difference, thereby realizing the phase lock.

Figure 7:
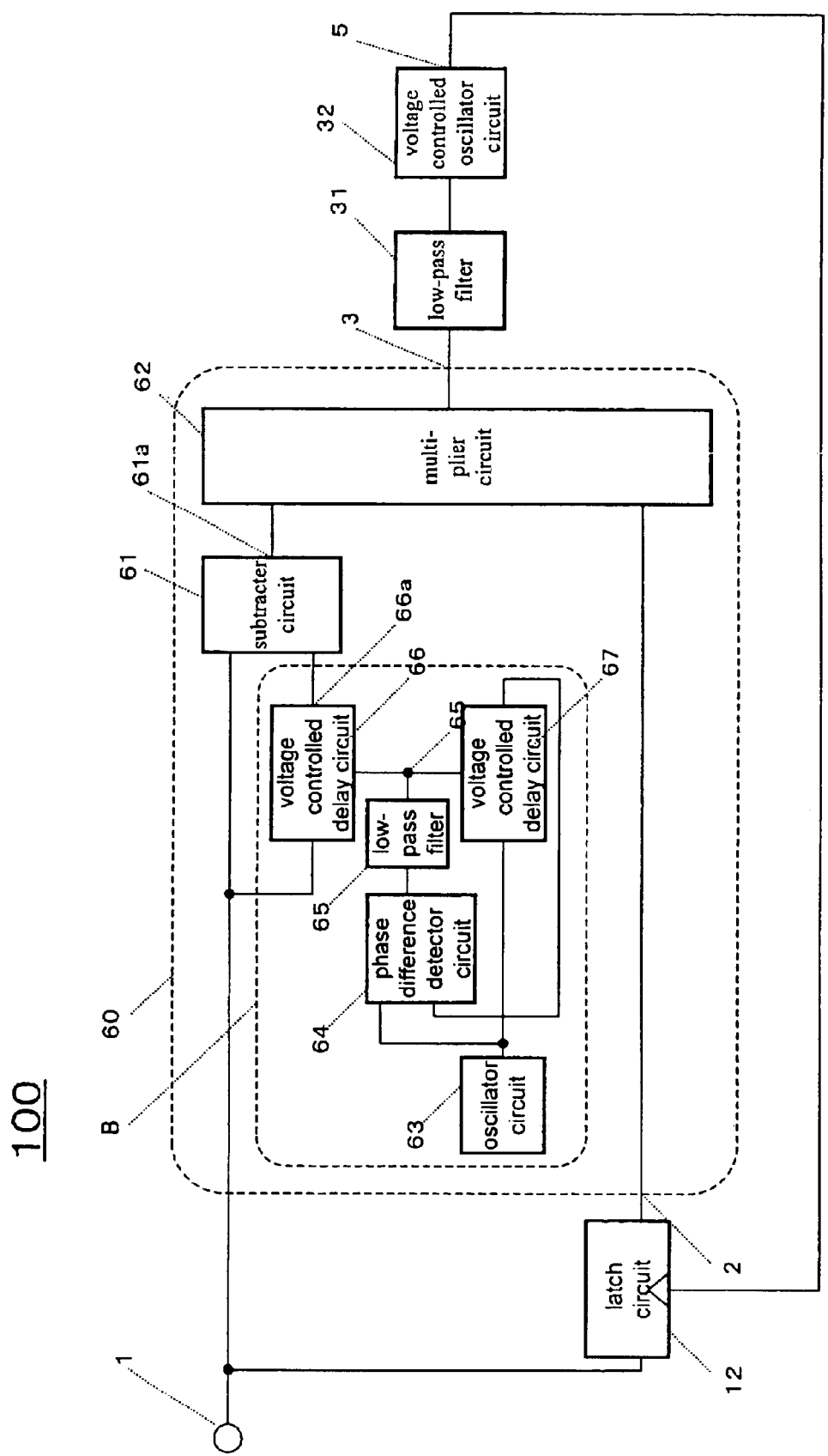
FIG. 7 is a block diagram of a PLL circuit according to the third embodiment of this invention.

FIG. 7 is a block diagram of the PLL circuit according to the third embodiment of this invention. Since a part in FIG. 7 assigned the same reference numeral as in FIG. 2 or 6 is the same component, the description thereof will be omitted. In FIG. 7, reference numeral 100 denotes a PLL circuit using a phase detector circuit of this invention, reference numeral 60 denotes a phase detector circuit of this invention, reference numeral 12 denotes a latch circuit for supplying the random NRZ signal to the input terminal 2 of the multiplier circuit, the random NRZ signal having the same pattern as that of the random NRZ signal input to the terminal 1 and phase information on the clock signal output from the terminal 5 of the voltage controlled oscillator circuit 32 (FIG. 2), and a D-type flip flop circuit or the like is used as the latch circuit. Reference numeral 31 denotes a low-pass filter, which involves an integration term in the transfer function thereof by being combined with a charge pump and so on in order to enhance the capability of preventing significant loss of lock when the CIDs signal are input, which is one of the characteristics of the PLL circuit 100. Reference numeral 32 denotes a voltage controlled oscillator circuit capable of changing the oscillation frequency according to the output of the low-pass filter 31.

Figure 8:
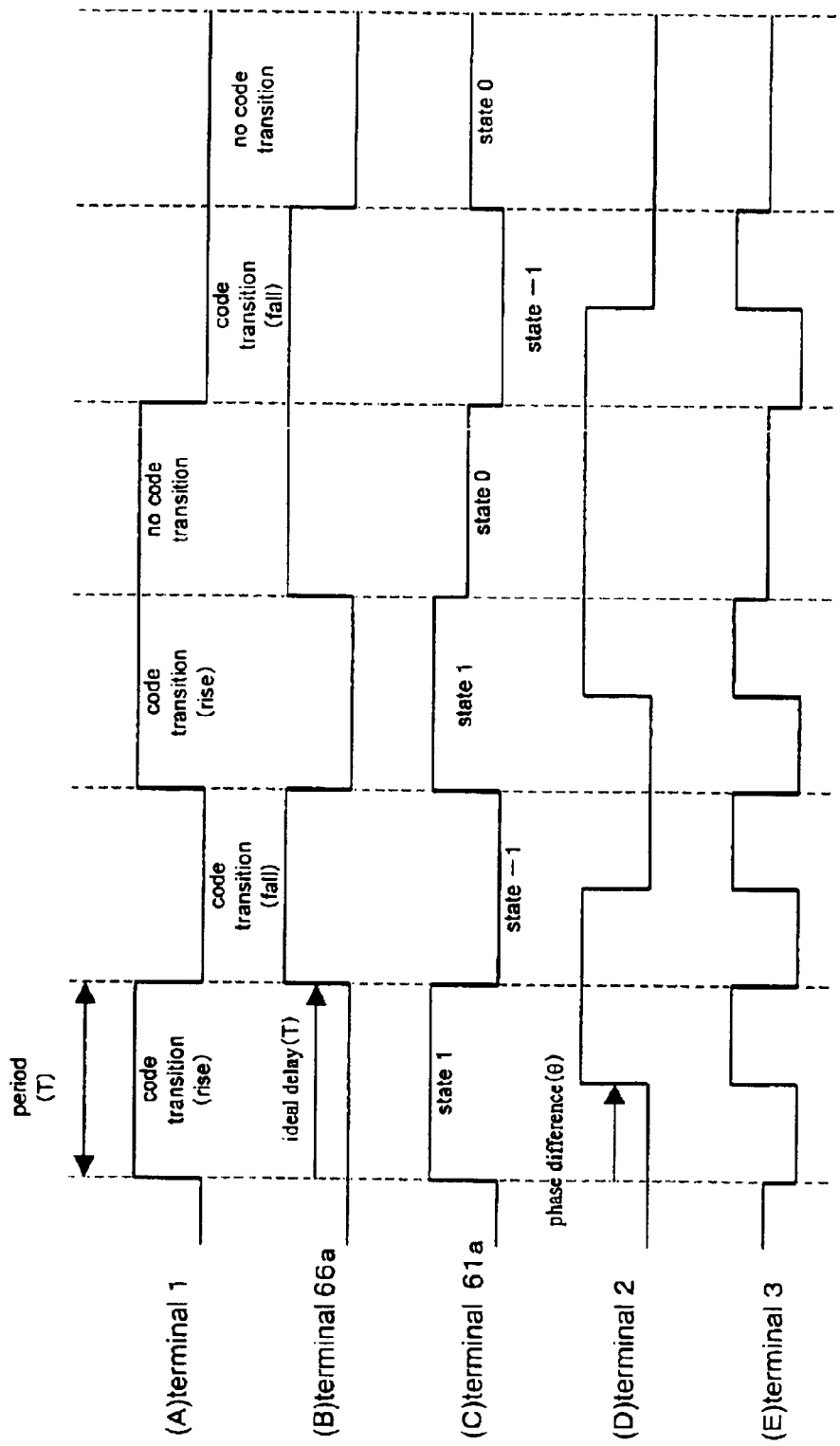
FIG. 8 is a timing chart for the phase detector circuit according to the third embodiment of this invention under phase-locked condition.

FIG. 8 is a timing chart for the phase detector circuit according to the third embodiment of this invention under phase-locked condition. FIG. 8(A) represents the random NRZ signal input to the terminal 1, FIG. 8(B) represents the signal at the output terminal 66a of the voltage controlled delay circuit 66, FIG. 8(C) represents the signal at the output terminal 61a of the subtracter circuit 61, which is one of the input signals of the multiplier circuit 62, FIG. 8(D) represents the signal at the other input terminal 2 of the multiplier circuit 62, and FIG. 8(E) represents the signal at the output terminal 3 of the multiplier circuit 62, which is the output signal of the phase detector circuit 60.

As shown in FIGS. 8(A) to 8(E), the signal at the terminal 66a has a waveform that is delayed exactly by the time of T, which is equivalent to the period of the random NRZ signal input to the terminal 1. This indicates that the circuitry composed of the oscillator circuit 63, the phase difference detection circuit 64, the low pass filter 65, and the voltage controlled delay circuits 66 and 67 functions as the ideal delay circuit B providing the delay of T exactly between the terminals 1 and 66a. This is realized under the conditions as follows:

(1) The period of the output clock signal of the oscillator circuit 63 is the same as the period T of the random NRZ signal input to the terminal 1;

(2) The feedback circuit composed of the phase difference detection circuit 64, the low pass filter 65, the voltage controlled delay circuit 67 provides the negative feedback, and thereby the delay between the input and the output of the voltage controlled delay circuit 67 equals to the period of the output clock signal of the oscillator circuit 63 so that delay-locked condiction is realized; and (3) In the case where the voltage controlled delayed circuits 66 and 67 have exactly the same control characteristic through introduction of the circuit integration technique, the delay between the input and the output of the voltage controlled delay circuit 67 becomes the delay between the input and the output of the voltage controlled delay circuit 66 as it is.

As described above, the delay between the input terminal 1 and the output terminal 66a of the voltage controlled delay circuit 66 is controlled indirectly by the negative feedback, so that it is not affected by the variation of power supply voltage, variation of temperature, variation in production or the like. The ideal delay precisely provides the time difference of T between the waveforms appearing at the two input terminals 1 and 66a of the subtracter circuit 61, the time difference T being equivalent to the period of these waveforms. Thus, the terminal 61a ideally exhibits the three states ("state 1", "state −1", and "state 0") depending on the code transition of the random NRZ signal input to the terminal 1 (during code transition or during input of the CIDs), and the incorrect determination of state seen in FIG. 5(C) does not appear. Multiplication of the signal at the terminal 61a and the random NRZ signal input to the terminal 2 in the multiplier circuit 62 results in a pulse appearing at the terminal 3, the pulse having a duty cycle associated with the phase difference between the random NRZ signals input to the terminals 1 and 2. This signal does not have the distortion seen in FIG. 5(E), and the average output levels for the respective periods are the same. This means that the output level of the low pass filter 31 does not irregularly vary, and accordingly, a jitter that would otherwise appear in the clock signal output from the voltage controlled oscillator circuit 32 can be suppressed, and the high quality of clock can be maintained.

In addition, as shown in FIG. 8(E), the duty cycle at the output terminal 3 of the phase detector circuit 60 attains 50% around phase-locked point, which means that the high linearity of the phase to voltage conversion characteristic can be realized. On the other hand, no pulse appears during input of the CIDs signal, and the low pass filter 31 receives no waveform and maintains the current state, so that the capability as the PLL circuit of preventing significant loss of lock can be realized. This has been described with reference to the first embodiment and the like.

The phase detector circuit 60 according to the third embodiment is characterized in that it is the phase detector circuit 10 according to the first embodiment shown in FIG. 1 having the delay circuit 11 thereof replaced with the ideal delay circuit B. Therefore, of course, it may have another circuit configuration that provides the ideal delay.

In addition, it may be the phase detector circuit 40 according to the second embodiment shown in FIG. 4 having the delay circuit 11 thereof replaced with a circuit providing the ideal delay, for example, the ideal delay circuit B.

As described above, according to the third embodiment, the PLL circuit capable of preventing a significant loss of lock during input of the CIDs included in the random NRZ signal can be realized by using the phase detector circuit having the circuit configuration as shown in FIG. 6. In addition, there is provided the high linearity of the phase to voltage conversion characteristic around phase-locked point, and the distortion in the output waveform of the phase detector circuit can be suppressed by providing the ideal delay through the negative feedback control, so that the PLL circuit capable of extracting the high quality clock signal with the low jitter characteristic can be realized.

Fourth Embodiment

Figure 9:
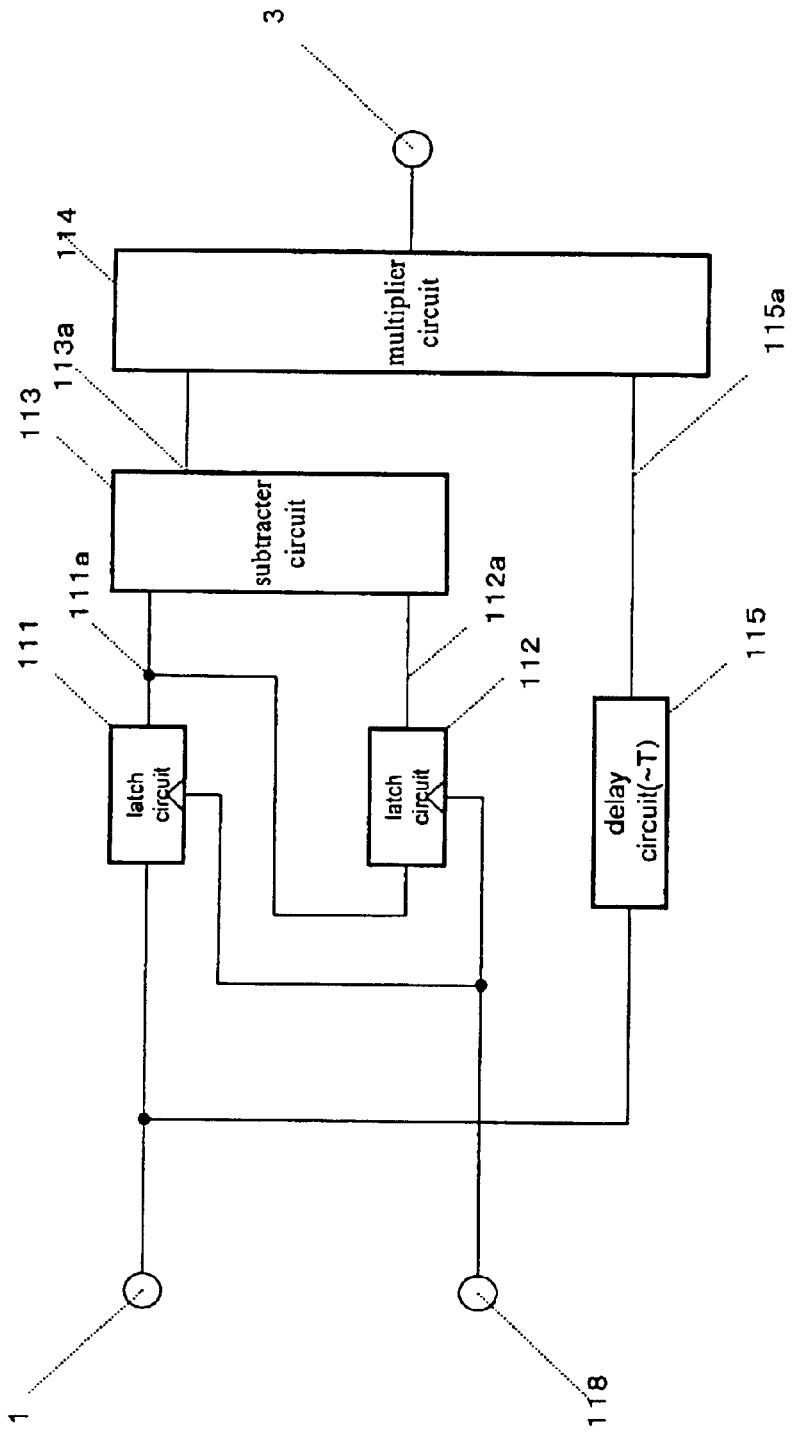
FIG. 9 is a block diagram of a phase detector circuit according to a fourth embodiment of this invention.

FIG. 9 is a block diagram of a phase detector circuit according to a fourth embodiment of this invention. In FIG. 9, reference numeral 110 denotes a phase detector circuit of this invention, reference numeral 1 denotes an input terminal for the random NRZ signal, reference numeral 118 denotes an input terminal for the clock signal, reference numeral 111 denotes a latch circuit (first latch circuit) for sampling the signal input to the terminal 1 at the clock signal input to the terminal 118, reference numeral 112 denotes a latch circuit (second latch circuit) for sampling the output signal of the latch circuit 111 at the clock signal input to the terminal 118, and a D-type flip flop or the like is used as the latch circuits 111 and 112. Reference numeral 113 denotes a subtracter circuit for providing the difference between the output signal of the latch circuit 111 and the output signal of the latch circuit 112, reference numeral 115 denotes a delay circuit for delaying the random NRZ signal input to the terminal 1 by the time of T, which is equivalent to the period thereof, reference numeral 114 denotes a multiplier circuit for providing the product of the output signal of the subtracter circuit 113 (output terminal 113a) and the output signal of the delay circuit 115 (output terminal 115a), and reference numeral 3 denotes an output terminal of the multiplier circuit 114 and is also the output terminal of the phase detector circuit 110.

As shown in FIG. 9, inputs are the random NRZ signal applied to the terminal 1 and the clock signal applied to the terminal 118. The PLL circuit can realize the phase lock through the negative feedback of the phase difference between the variation edge (rising or falling) of the random NRZ signal and the rising edge of the clock signal.

The PLL circuit using the phase detector circuit 110 is the PLL circuit 100 according to the third embodiment shown in FIG. 7 having the phase detector circuit 60 and the latch circuit 12 thereof replaced with the phase detector circuit 110.

Figure 10:
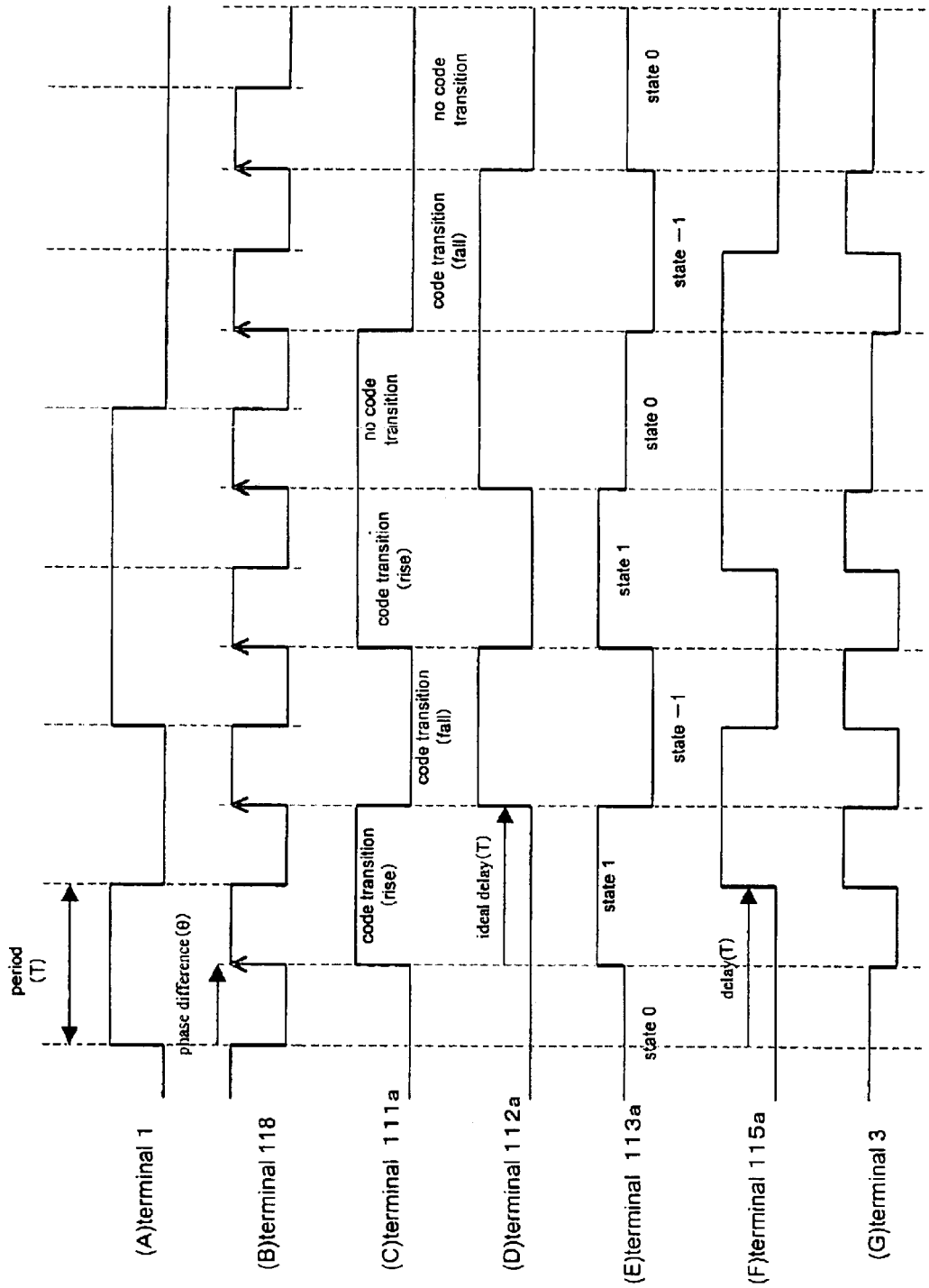
FIG. 10 is a timing chart for the phase detector circuit according to the fourth embodiment of this invention under phase-locked condition.

FIG. 10 is a timing chart for the phase detector circuit according to the fourth embodiment of this invention under phase-locked condition. FIG. 10(A) represents the random NRZ signal input to the terminal 1, FIG. 10(B) represents the clock signal input to the terminal 118, FIG. 10(C) represents the signal at the output terminal 111a of the latch circuit 111, FIG. 10(D) represents the signal at the output terminal 112a of the latch circuit 112, FIG. 10(E) represents the signal at the output terminal 113a of the subtracter circuit 113, FIG. 10(F) represents the signal at the output terminal 115a of the delay circuit 115, and FIG. 10(G) represents the signal at the output terminal 3 of the multiplier circuit 114, which is the output signal of the phase detector circuit 110.

As shown in FIGS. 10(A) to 10(G), the waveforms at the two input terminals 111a and 112a of the subtracter circuit 113 exhibit exactly the difference of T, which is equivalent to the period of these waveforms. This ideal delay is attributed to the fact that the latch circuits 111 and 112 that output these waveforms operate on the same clock signal input to the terminal 118, and therefore, it is not affected by the variation of power supply voltage, variation of temperature, variation in production or the like. The ideal delay realized enables the operation, in which a pulse having the duty cycle associated with the phase difference between the two signals appears in the output terminal 3 of the phase detector circuit 110 without any distortion during code transition and no pulse appears during input of the CIDs, to be realized as in the third embodiment.

Here, in the delay circuit 115 included in the phase detector circuit 110, the deviation of the delay time affects the phase difference under phase-locked condition between the random NRZ signal input to terminal 1 and the clock signal input to the terminal 118. However, unlike the case of the delay circuit 11 included in the phase detector circuit 10 according to the first embodiment, the deviation of the delay time does not degrade the quality of the clock signal extracted in the PLL circuit, that is, does not cause the jitter or the like. Thus, the delay circuit 115 may be implemented by not only a circuit such as the ideal delay circuit A shown in FIG. 6 but also a simple circuit such as a buffer circuit.

As described above, according to the fourth embodiment, by using the phase detector circuit having the circuit configuration as shown in FIG. 9, there is provided the same advantage as in the third embodiment, that is, the advantage that the PLL circuit capable of preventing a significant loss of lock during input of the CIDs included in the random NRZ signal can be realized, the high linearity of the phase to voltage conversion characteristic around phase-locked point is provided, and the distortion in the output waveform of the phase detector circuit can be suppressed by providing the ideal delay using the two latch circuit, so that the PLL circuit capable of extracting the high quality clock signal with the low jitter characteristic can be realized. In addition, the fourth embodiment is advantageously more suitable for miniaturization of the circuit and reduction of power consumption than the first embodiment.

Fifth Embodiment

Figure 11:
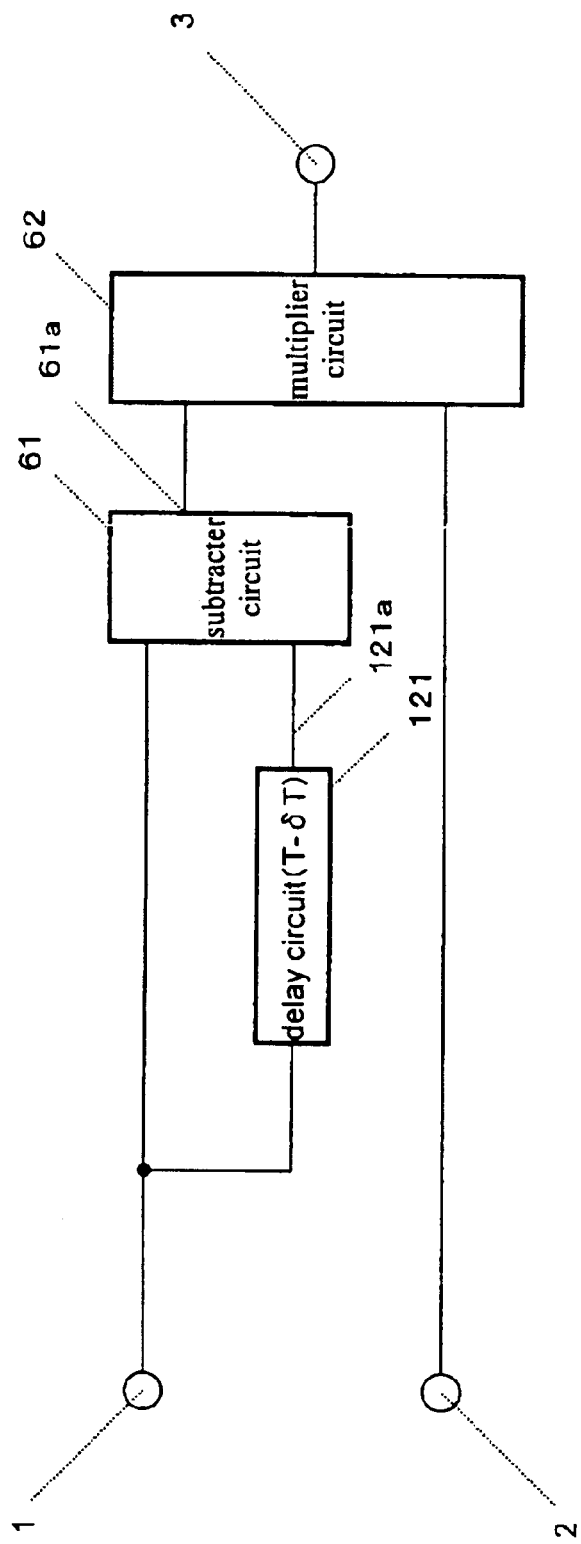
FIG. 11 is a block diagram of a phase detector circuit according to a fifth embodiment of this invention.

FIG. 11 is a block diagram of a phase detector circuit according to a fifth embodiment of this invention. In FIG. 11, reference numeral 120 denotes a phase detector circuit of this invention, reference numeral 1 denotes an input terminal for the random NRZ signal, reference numeral 2 denotes an input terminal for the random NRZ signal having the same period and pattern as those of the signal input to the terminal 1 and delayed by θ in phase, reference numeral 121 denotes a delay circuit for outputting the signal delayed by the time of (T−δT), which is a little shorter than the period T of the random NRZ signal input to the terminal 1, reference numeral 61 denotes a subtracter circuit for providing the difference between the signal input to the terminal 1 and the output signal of the delay circuit 121 (output terminal 121a), reference numeral 62 denotes a multiplier circuit for providing the product of the output signal of the subtracter circuit 61 (output terminal 61a) and the signal input to the terminal 2, and reference numeral 3 denotes an output terminal of the multiplier circuit 62 and is also the output terminal of the phase detector circuit 120.

As shown in FIG. 11, inputs are the random NRZ signals applied to the terminals 1 and 2, which have the same pattern. However, the signals are different in phase, and the PLL circuit provides the negative feedback of the phase difference, thereby realizing the phase lock.

The PLL circuit using the phase detector circuit is the PLL circuit 100 according to the third embodiment shown in FIG.

7 having the phase detector circuit 60 thereof replaced with the phase detector circuit 120.

Figure 12:
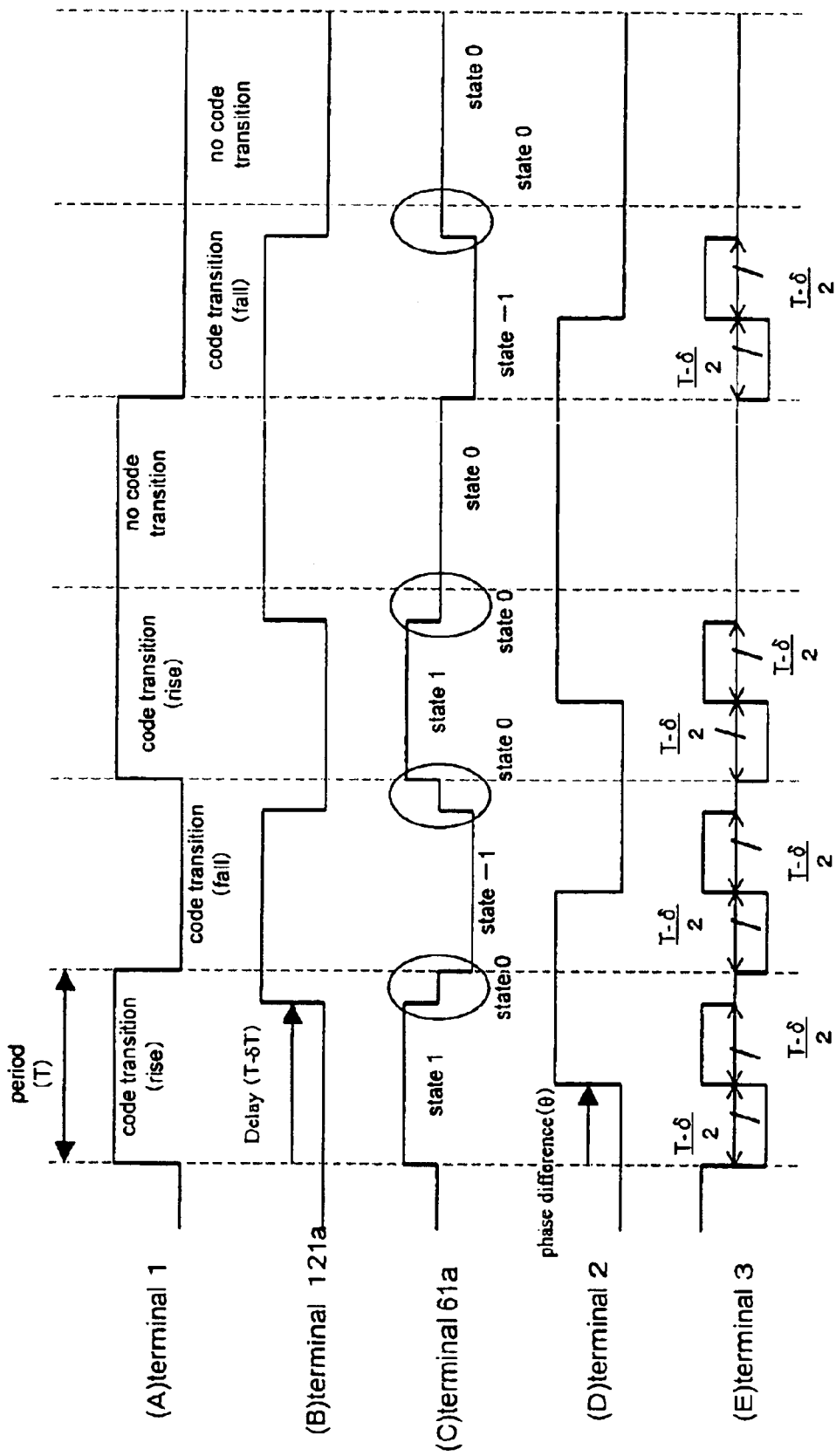
FIG. 12 is a timing chart for the phase detector circuit according to the fifth embodiment of this invention under phase-locked condition.

FIG. 12 is a timing chart for the phase detector circuit according to the fifth embodiment of this invention under phase-locked condition. FIG. 12(A) represents the random NRZ signal input to the terminal 1, FIG. 12(B) represents the signal at the output terminal 121a of the delay circuit 121, FIG. 12(C) represents the signal at the output terminal 61a of the subtracter circuit 61, which is one of the input signals of the multiplier circuit 62, FIG. 12(D) represents the signal at the other input terminal 2 of the multiplier circuit 62, FIG. 12(E) represents the signal at the output terminal 3 of the multiplier circuit 62, which is the output signal of the phase detector circuit 120.

As shown in FIGS. 12(A) to 12(E), according to the code transition of the random NRZ signal input to the terminal 1 (during code transition or during input of the CIDs signal), the output terminal 61a exhibits one of three states ("state 1", "state −1", or "state 0"). However, due to the deviation in the delay time of δT in the delay circuit 121, the "state 0" is always attained in the last δT in the period during which the code is changed at the terminal 1. Multiplication of this waveform and the random NRZ signal input to the terminal 2 in the multiplier circuit 61 results in a waveform at the terminal 3, the waveform having a duty cycle associated with the phase difference between the signals input to the terminals 1 and 2, in this waveform also, the waveform is distorted during the last δT in the period. However, in this waveform, the average output levels are the same among the periods. This means that although the output signal of the phase detector circuit 120 is distorted, the distortion is not irregular, so that the output level of the low pass filter 31 of the PLL circuit does not fluctuate, as a result, the jitter in the clock signal output from the voltage controlled oscillator circuit 32 can be suppressed, and the high quality of the clock signal can be maintained.

The result described above is provided when the delay in the delay circuit 121 is (T−δT), which is a little shorter than the period T, that is, in the case of δT>0. The delay circuit 121 may be implemented by not only a circuit such as the ideal delay circuit B shown in FIG. 7 but also a simple circuit such as a buffer circuit.

If the δT is set to be sufficiently smaller than the period T, the pulse width of the waveform at the output terminal 3 of the phase detector circuit 120 is not so narrow as shown in FIG. 12(E), so that the high linearity of the phase to voltage conversion characteristic can be assured. In addition, during input of the CIDs signal, any waveform is not output from the terminal 3, so that the capability of preventing a significant loss of lock can be realized by maintaining the current state as the PLL circuit.

In the phase detector circuit 120 according to this invention shown in FIG. 11, the input signals applied to the terminals 1 and 2 are represented by Vi(t) and Vi(t−θT/2π), respectively. Here, reference symbol θ represents the phase difference of the signal at the terminal 2 with respect to the input signal at the terminal 1, and accordingly, the term θT/2π represents the time delay of the signal at the terminal 2 with respect to the input signal at the terminal 1. Since the output signal of the delay circuit 121 that delays the random NRZ signal input to the terminal 1 by T−δT, which is a little shorter than the time T equivalent to the period thereof, can be represented by Vi(t−(T−δT)), the signal Vo(t) at the output terminal 3 of the multiplier circuit 62, which is the output of the phase detector circuit 120, can be represented by the formula (3):

$$Vo(t)=(Vi(t)-Vi(t-(T-\delta T)))\times Vi(t-\theta T/2\pi) \quad (3)$$

Therefore, instead of the circuit configuration of the phase detector circuit 120 shown in FIG. 11, another circuit configuration that satisfies the formula (3) may be used.

As described above, according to the fifth embodiment, by using the phase detector circuit having the circuit configuration as shown in FIG. 11, even if the delay is deviated due to the various variations, there is provided the same advantage as in the third or fourth embodiment, that is, the advantage that the PLL circuit capable of preventing a significant loss of lock during input of the CIDs included in the random NRZ signal can be realized, the high linearity of the phase to voltage conversion characteristic around phase-locked point is provided, and any irregular distortion does not appear in the output waveform of the phase detector circuit, so that the PLL circuit capable of extracting the high quality clock signal with the low jitter characteristic can be realized. In addition, the fifth embodiment is advantageously suitable for miniaturization of the circuit and reduction of power consumption.

The third embodiment to fifth embodiment are devised in view of the problem of how to suppress the distortion in the output waveform caused by the variation of the power supply voltage, variation of temperature, variation in production or the like in the phase detector circuit 10 according to the first embodiment shown in FIG. 1, in which, in order to solve the problem, the third embodiment and fourth embodiment involve suppressing the deviation of the delay caused by the above described variations in the delay circuit 11 included in the phase detector circuit 10 according to the first embodiment, and the fifth embodiment involves preventing the irregular distortion in the output waveform that degrade the quality of clock.

As described above, with the phase detector circuit according to this invention, by using the circuit configuration as represented by the formula (1) (FIGS. 1, 6, and 9) or formula (2) (FIG. 4), the phase detector circuit that prevents a significant loss of lock during input of the CIDs and have a high linearity of the phase to voltage conversion characteristic around phase-locked point in the operation of comparing the phases of random NRZ signals in the PLL circuit.

In addition, with the phase detector circuit according to this invention, by using the circuit configuration as represented by the formula (3) (FIG. 11), in the PLL circuit used for extracting a clock from the random NRZ signal and recovering the signal, the mechanism for preventing a significant loss of lock during input of the CIDs signal is realized, the high linearity of the phase to voltage conversion characteristic around phase-locked point is provided, and any irregular distortion in the output waveform is suppressed, so that the PLL circuit capable of extracting the high quality clock signal with the low jitter characteristic can be provided.

INDUSTRIAL APPLICABILITY

As described above, the phase detector circuit according to this invention is useful as the phase detector circuit capable of preventing a significant loss of lock during input of the CIDs and having a high linearity of the phase to voltage conversion characteristic around phase-locked point in the operation of comparing the phases of random NRZ signals in the PLL circuit. In particular, it is appropriate as the phase detector circuit capable of implementing the mechanism for preventing a significant loss of lock during input of the CIDs signal, providing the high linearity of the phase to voltage conversion characteristic around phase-locked point, and suppressing any irregular distortion in the output waveform in the PLL circuit used for extracting a clock from the random NRZ signal and recovering the signal, thereby realizing the PLL circuit capable of extracting the high quality clock signal with the low jitter characteristic.

What is claimed is:

1. A phase detector circuit that receives a random NRZ signal Vi(t) having a period of T and a signal Vi(t−θT/2π) having the same period and pattern as those of the signal Vi(t) and delayed from the signal Vi(t) by θ in phase, and outputs a signal including a DC voltage component associated with a phase difference θ between said two signals, wherein an output Vo(t) of the phase detector circuit is represented by:

$$Vo(t)=(Vi(t)-Vi(t-T))\times Vi(t-\theta T/2\pi),$$

where the signal Vi(t−T) is delayed from the signal Vi(t) by the period T of the signal Vi(t).

2. A phase detector circuit that outputs a signal including a DC voltage component associated with a phase difference between two input signals, comprising:

a delay circuit for outputting a signal delayed by the time of T, which is a period of an input random NRZ signal;

a subtracter circuit for outputting a difference between said input random NRZ signal and the signal delayed by said delay circuit; and a multiplier circuit for outputting a product of another input random NRZ signal having the same pattern as that of said input random NRZ signal and said phase difference and an output of said subtracter circuit.

3. A phase detector circuit that outputs a signal including a DC voltage component associated with a phase difference between two input signals, comprising:

a delay circuit for outputting a signal delayed by the time of (T−δT), which is shorter than the period T of an input random NRZ signal;

a subtracter circuit for outputting a difference between said input random NRZ signal and the signal delayed by said delay circuit;

a multiplier circuit for outputting a product of another input random NRZ signal having the same pattern as that of said input random NRZ signal and said phase difference and an output of said subtracter circuit.

4. A phase detector circuit that receives a random NRZ signal Vi(t) having a period of T and a signal Vi(t−θT/2π) having the same period and pattern as those of the signal Vi(t) and delayed from the signal Vi(t) by θ in phase, and outputs a signal including a DC voltage component associated with a phase difference θ between said two signals, wherein an output Vo(t) of the phase detector circuit is represented by:

$$Vo(t)=(Vi(t)-Vi(t-(T-\delta T)))\times Vi(t-\theta T/2\pi),$$

where the signal Vi(t−(T−δT)) is delayed from the signal Vi(t) by the time of (T−δT), which is shorter than the period T of the signal Vi(t).

5. A phase detector circuit that outputs a DC voltage signal associated with a phase difference between an input random NRZ signal and a second signal related to said input random NRZ signal, comprising:

a delay circuit for delaying said input random NRZ signal by an amount related to a period T of said input random NRZ signal and outputting a delayed signal; and a combination of at least one multiplier circuit and a subtracter circuit, which combination performs an arithmetic operation on only said input random NRZ signal, said delayed signal, and said second signal to produce an output signal having a DC voltage component corresponding to said phase difference.

6. The phase detector circuit of claim 5, wherein said second signal is the same as said input random NRZ signal but differing in phase therefrom by an angle θ, and said delay circuit delays said input random NRZ signal by a value of T.

7. The phase detector circuit of claim 5, wherein said second signal is the same as said input random NRZ signal but differing in phase therefrom by an angle θ, and said delay circuit delays said input random NRZ signal by a value of (T−δT), where δT Is a value less than T.

8. The phase detector circuit of claim 5, wherein said delay circuit comprises a first voltage-controlled delay circuit and a control circuit for controlling said voltage-controlled delay circuit.

9. The phase detector circuit of claim 6, wherein said combination comprises a first multiplier circuit for multiplying said input random NRZ signal with said second signal, a second multiplier circuit for multiplying said second signal with the output of said delay circuit, and said subtracter circuit subtracts the output of said second multiplier circuit from the output of said first multiplier circuit.

* * * * *

UNITED STATES PATENT AND TRADEMARK OFFICE
CERTIFICATE OF CORRECTION

PATENT NO. : 6,888,379 B2
DATED : May 3, 2005
INVENTOR(S) : Yasuhito Takeo et al.

It is certified that error appears in the above-identified patent and that said Letters Patent is hereby corrected as shown below:

Title page,
Item [75], Inventor, correct the spelling of first named inventor from "Yasuhiko" to -- Yasuhito --.

Signed and Sealed this

Twelfth Day of July, 2005

JON W. DUDAS
*Director of the United States Patent and Trademark Office*